(12) United States Patent
Hashemi et al.

(10) Patent No.: US 10,672,891 B2
(45) Date of Patent: Jun. 2, 2020

(54) STACKED GATE ALL AROUND MOSFET WITH SYMMETRIC INNER SPACER FORMED VIA SACRIFICIAL PURE SI ANCHORS

(71) Applicant: International Business Machines Corporation, Armonk, NY (US)

(72) Inventors: Pouya Hashemi, White Plains, NY (US); Takashi Ando, Tuckahoe, NY (US); Choonghyun Lee, Rensselaer, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/152,022

(22) Filed: Oct. 4, 2018

(65) Prior Publication Data
US 2020/0111888 A1    Apr. 9, 2020

(51) Int. Cl.
*H01L 29/66* (2006.01)
*H01L 29/06* (2006.01)
*H01L 29/08* (2006.01)
*H01L 21/311* (2006.01)
*H01L 29/78* (2006.01)
*H01L 29/423* (2006.01)
*H01L 21/3065* (2006.01)

(52) U.S. Cl.
CPC .... *H01L 29/6681* (2013.01); *H01L 21/31105* (2013.01); *H01L 29/0653* (2013.01); *H01L 29/0673* (2013.01); *H01L 29/0847* (2013.01); *H01L 29/42392* (2013.01); *H01L 29/6653* (2013.01); *H01L 29/66545* (2013.01); *H01L 29/66553* (2013.01); *H01L 29/7853* (2013.01); *H01L 21/3065* (2013.01)

(58) Field of Classification Search
None
See application file for complete search history.

(56) References Cited

U.S. PATENT DOCUMENTS

| | | | |
|---|---|---|---|
| 8,895,406 B2 * | 11/2014 | Rogers | B81C 1/0046 438/455 |
| 9,029,834 B2 | 5/2015 | Bangsaruntip et al. | |
| 9,276,064 B1 | 3/2016 | Zang et al. | |

(Continued)

OTHER PUBLICATIONS

Loubet et al., "Stacked Nanosheet Gate-All-Around Transistor to Enable Scaling Beyond FinFET," Symposium on VLSI Technology Digest of Technical Papers, 2017, pp. T230-T231.

*Primary Examiner* — Zandra V Smith
*Assistant Examiner* — Lawrence C Tynes, Jr.
(74) *Attorney, Agent, or Firm* — Yee & Associates, P.C.

(57) ABSTRACT

A method of forming a stacked gate all around MOSFET is provided. A stack of alternating layers of Si and SiGe are formed on a substrate. A number of holes are etched through the stack and Si anchors formed in the holes. The SiGe layers are removed. A number of dummy gates are formed on the substrate and a Low-K spacer material deposited around the dummy gates. A number of S/D recesses are etched through the Si layers, removing the Si anchors. The dummy gates and spacer material preserves sections of the Si layers during etching, forming stacks of Si channels. S/Ds are formed in the recesses. The dummy gates are then removed replaced with metal gate stacks.

20 Claims, 16 Drawing Sheets

(56) References Cited

U.S. PATENT DOCUMENTS

| | | | |
|---|---|---|---|
| 9,620,590 B1 | 4/2017 | Bergendahl et al. | |
| 9,647,139 B2 | 5/2017 | Doris et al. | |
| 9,842,914 B1 | 12/2017 | Yeung et al. | |
| 9,923,055 B1 | 3/2018 | Cheng et al. | |
| 2008/0108171 A1* | 5/2008 | Rogers | B81C 1/0046 |
| | | | 438/73 |
| 2014/0001441 A1 | 1/2014 | Kim et al. | |
| 2015/0069328 A1 | 3/2015 | Leobandung | |
| 2016/0276326 A1* | 9/2016 | Natarajan | H01L 25/167 |
| 2017/0221992 A1 | 8/2017 | Chang et al. | |
| 2017/0278733 A1* | 9/2017 | Chang | H01L 33/44 |
| 2018/0053837 A1 | 2/2018 | Bi et al. | |
| 2018/0233536 A1* | 8/2018 | Chang | H01L 27/156 |

\* cited by examiner

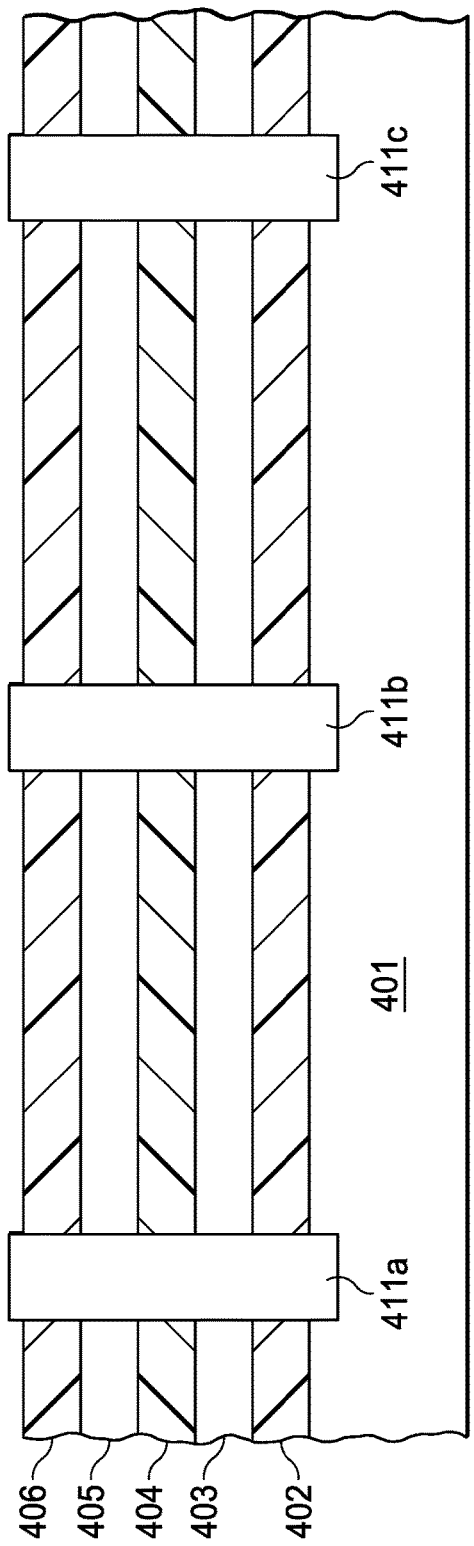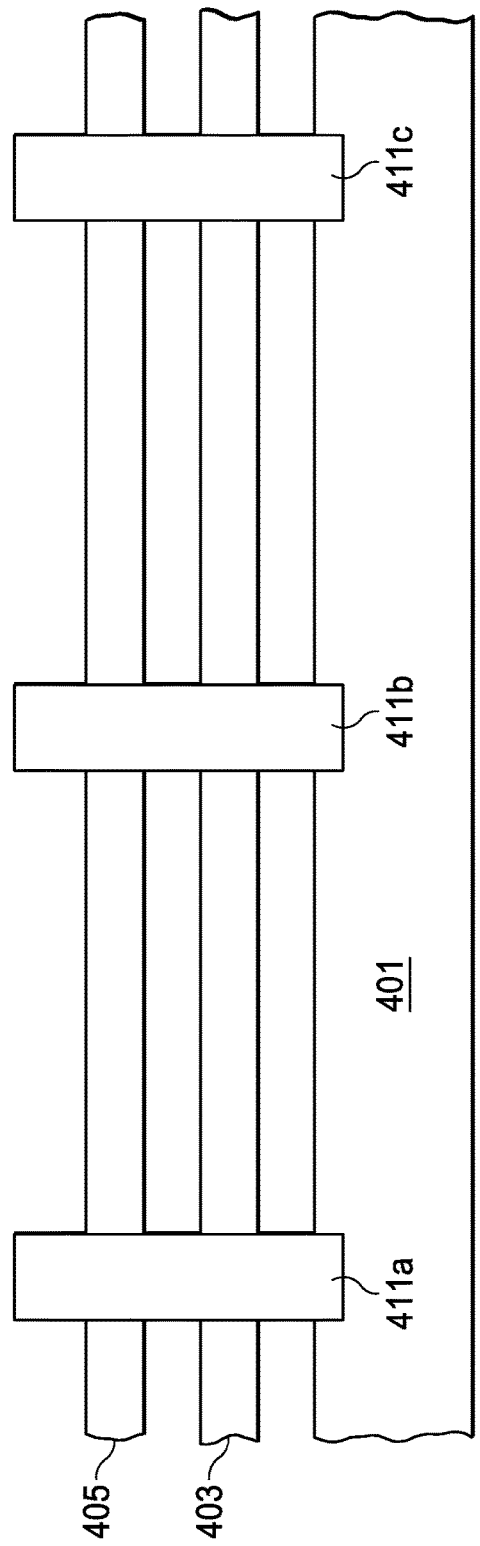

STACKED GATE ALL AROUND MOSFET WITH SYMMETRIC INNER SPACER FORMED VIA SACRIFICIAL PURE SI ANCHORS

BACKGROUND

The disclosure relates generally to integrated circuit devices and associated fabrication techniques, and more specifically to a semiconductor device with a stacked gate structure and associated fabrication method.

Semiconductor structures or devices are typically embodied as one or more metal-oxide-semiconductor field effect transistors (MOSFETs) comprising an integrated circuit (IC or chip). A recent innovation in MOSFET design is the so-called FinFET, in which a thin silicon fin on top of the substrate forms the channel, with gates on either side of the fin, as shown in FIG. 1. Each fin 110 is surrounded by a gate 120 in three directions: one on each side and one on top. Tight fin pitch, taller fin height, and thinner fin width can deliver performance improvements and area scaling. However, fabrication challenges and lack of further scaling improvement for FinFETs have pushed the industry toward new architectures.

As ICs are being scaled to smaller dimensions, stacked nanosheet FETs have been developed to increase effective channel width ($W_{\mathit{eff}}$) within a given footprint. FIG. 2 depicts the basic schema of nanosheets as gate all around FETs. Conceptually, nanosheets can be thought of as FinFETs turned on their side. This arrangement allows additional channels (sheets) to be added within the same footprint, thereby improving scaling. As depicted in FIG. 2, in stacked nanosheets, each sheet 210 is surrounded by a gate 220 on all sides, i.e. gate all around (GAA). The sheet-to-sheet gap is optimized to reduce parasitic capacitance.

Stacked Si nanowires/nanosheets are touted for advanced nodes and beyond due to enhanced scalability over FinFETs and compatibility with the VLSI (very large scale integration) approaches. Common methods to make GAA stacked requires an inner spacer to reduce gate-to-S/D epitaxial parasitics, which makes them non-self-aligned and asymmetric.

FIG. 3 illustrates a stacked gate structure in accordance with prior art methods of manufacture. In this example, the gate structure 300 comprises multiple silicon channels 302 formed over a silicon (Si) substrate 301. An epitaxial source/drain 310 is formed along the side of the gate stack (another, not shown, is also formed along the opposite side of the stack). Between the Si channels 302 are inner spacers 330 that are used during formation of the gate stack.

Typically with prior art methods, the dummy gate is removed before the nanosheets are released. As a result, half-moon shaped spacers 320 are formed when removing the sacrificial silicon germanium (SiGe) (not shown) between the Si channels 302, leading to increased gate-source/drain (S/D) fringe capacitance and potential short. This half-moon shape creates a breach 321 between the spacer and the Si channel. This breach 321 is a weak point at the corner that creates a possible leakage path between the gate to the S/D 310.

SUMMARY

A method of forming a stacked gate all around MOSFET, comprising stacking a number of semiconductor layers on a substrate, wherein the stacked layers alternate between a primary semiconductor material and a sacrificial semiconductor material. A number of holes are etched through the stacked layers. Anchors are formed in the holes, wherein the anchors comprise the primary semiconductor material. The sacrificial semiconductor material is removed. A number of dummy gates are formed on the substrate. A layer of spacer material is deposited around the dummy gates. A number of source/drain (S/D) recesses are etched through the layers of primary semiconductor material, thereby removing the anchors, wherein the dummy gates and spacer material preserve semiconductor channels from among the layers of primary semiconductor material during etching of the S/D recesses. S/Ds are formed in the S/D recesses. The dummy gates are removed and metal gates formed in the spaces left by the dummy gates.

A method of forming a stacked gate all around MOSFET, wherein a stack of alternating layers of Si and SiGe are formed on a substrate. A number of holes are etched through the stack and Si anchors formed in the holes. The SiGe layers are removed. A number of dummy gates are formed on the substrate and a Low-K spacer material deposited around the dummy gates. A number of S/D recesses are etched through the Si layers, removing the Si anchors. The dummy gates and spacer material preserves sections of the Si layers during etching, forming stacks of Si channels. S/Ds are formed in the recesses. The dummy gates are then removed replaced with metal gate stacks.

A stacked gate all around MOSFET, comprising: a substrate; a number of stacked Si channels over the substrate; a metal gate surrounding the stacked Si channels; a spacer surrounding the metal gate stack; a source/drain (S/D) on opposite ends of the stacked Si channels; and a Si pad protruding from the substrate into the bottom surface of each S/D.

BRIEF DESCRIPTION OF THE DRAWINGS

FIG. 8 depicts the semiconductor layers with the etch mask removed in accordance with illustrative embodiments;

FIG. 9 depicts removal of the SiGe layers from the substrate in accordance with illustrative embodiments;

DETAILED DESCRIPTION

Aspects of the present invention are described herein with reference to diagrams of methods and apparatuses according to embodiments of the invention. The diagrams in the Figures illustrate the architecture and operation of possible implementation methods according to various embodiments of the present invention.

The illustrative embodiments provide techniques for fabricating semiconductor devices comprised of one or more nanosheet field effect transistors (FETs). Such fabrication techniques advantageously improve performance of semiconductor devices. While illustrative embodiments are described herein with respect to hybrid channel nanosheet FETs, alternative embodiments may be implemented with other types of semiconductor structures.

Furthermore, it should be understood that embodiments discussed herein are not limited to the particular materials, features, and processing steps shown. The descriptions provided herein are not intended to encompass all of the steps that may be used to form a functional integrated circuit device. Certain steps that are commonly used in fabricating such devices are purposefully not described herein for economy of description.

As explained in detail below, the illustrative embodiments of the present disclosure take the opposite approach of the prior art by forming an anchor in the S/D and releasing the nanosheets before removing the dummy gate. The final structure has a bump at the bottom of the S/D as a result of the anchor.

As used herein, the phrase "a number" means one or more. The phrase "at least one of", when used with a list of items, means different combinations of one or more of the listed items may be used, and only one of each item in the list may be needed. In other words, "at least one of" means any combination of items and number of items may be used from the list, but not all of the items in the list are required. The item may be a particular object, a thing, or a category.

For example, without limitation, "at least one of item A, item B, or item C" may include item A, item A and item B, or item C. This example also may include item A, item B, and item C or item B and item C. Of course, any combinations of these items may be present. In some illustrative examples, "at least one of" may be, for example, without limitation, two of item A; one of item B; and ten of item C; four of item B and seven of item C; or other suitable combinations.

Figure 4:
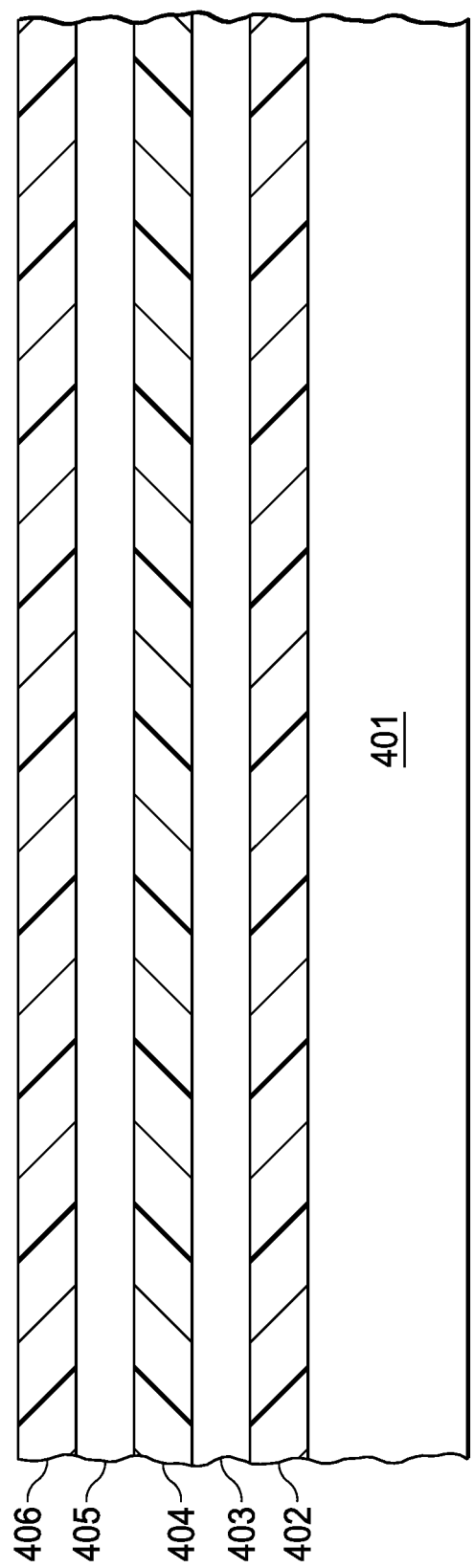
FIG. 4 depicts a layered stack of semiconducting materials in accordance with illustrative embodiments.

FIG. 4 depicts a layered stack of semiconducting materials in accordance with illustrative embodiments. The layered stack comprises a Si substrate 401. Alternating layers of SiGe 402, 404, 406 and Si 403, 405 are formed on top of the substrate 401. In one embodiment the method of deposition is epitaxy such in a rapid thermal chemical vapor deposition (RTCVD). The Si layers 403, 405 will later form the Si channels of the stacked nanosheet structure.

Figure 5:
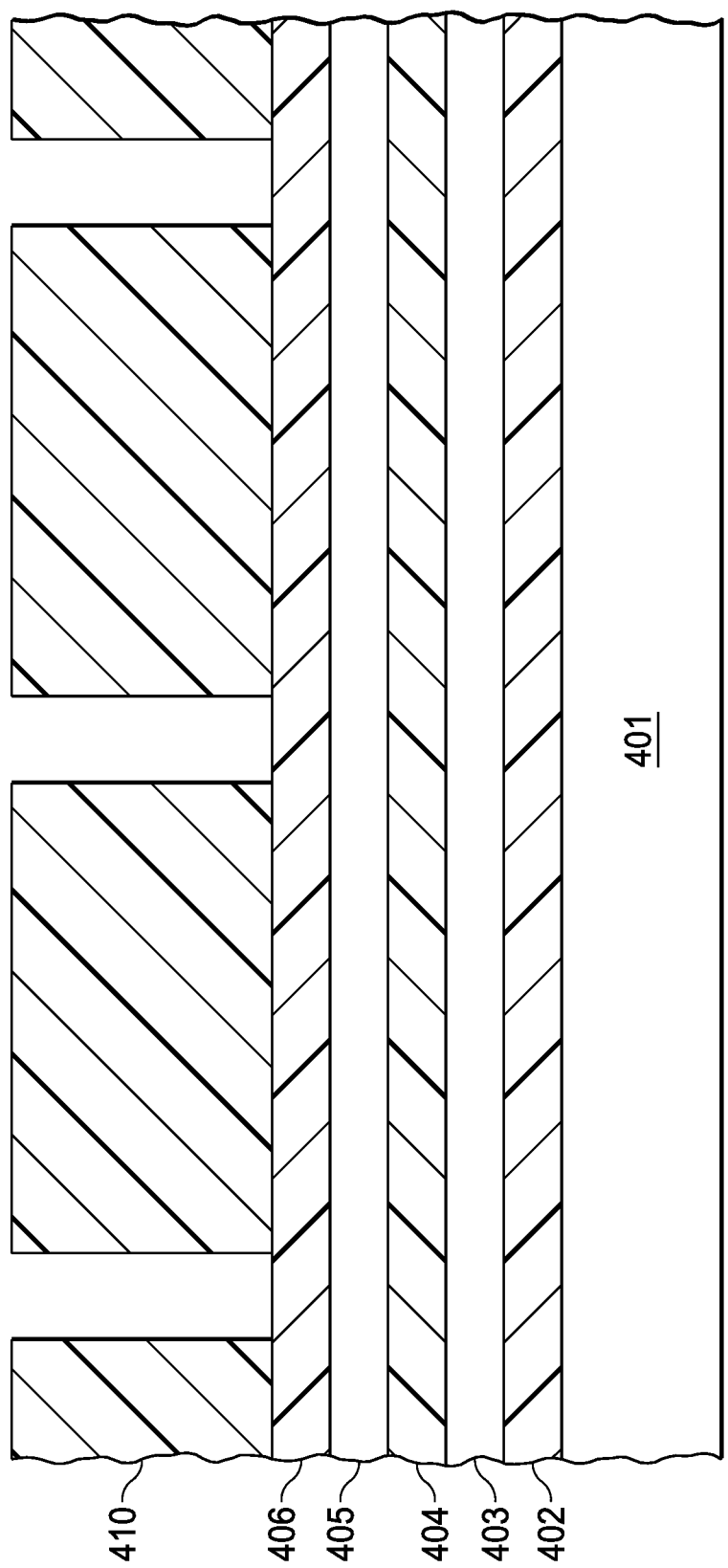
FIG. 5 depicts the semiconductor layers with a lithography mask in accordance with illustrative embodiments.

FIG. 5 depicts the semiconductor layers with a lithography mask in accordance with illustrative embodiments. The mask 410 is a UV-sensitive lithographic mask made of hydrogen silsesquioxane (HSQ) or other suitable material.

Figure 6:
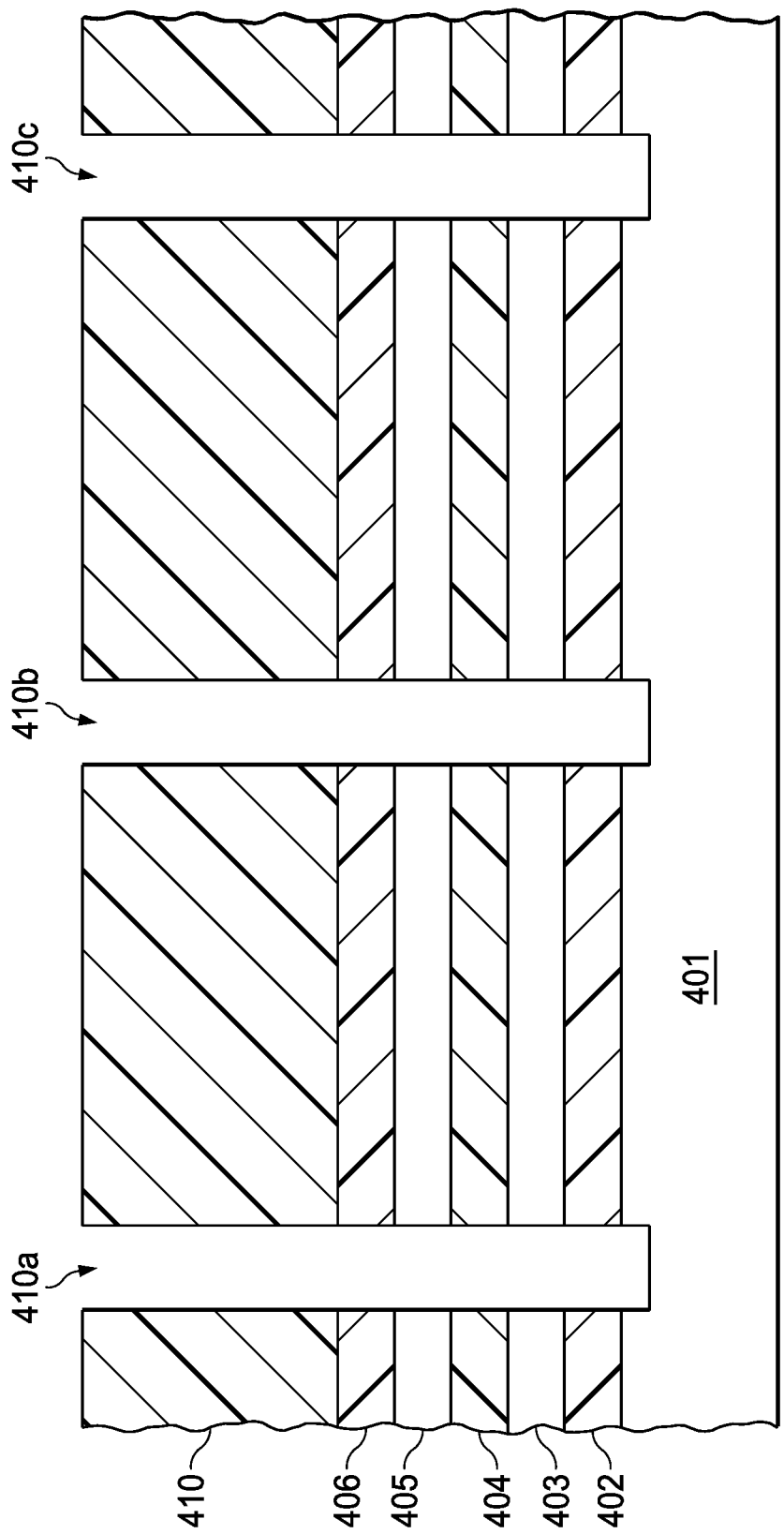
FIG. 6 depicts etch trenches through the semiconductor layers in accordance with illustrative embodiments.

FIG. 6 depicts etch trenches through the semiconductor layers in accordance with illustrative embodiments. In this step UV lithographic etching forms etch trenches 410a, 410b, 410c through the semiconductor layers 402-406.

Figure 7:
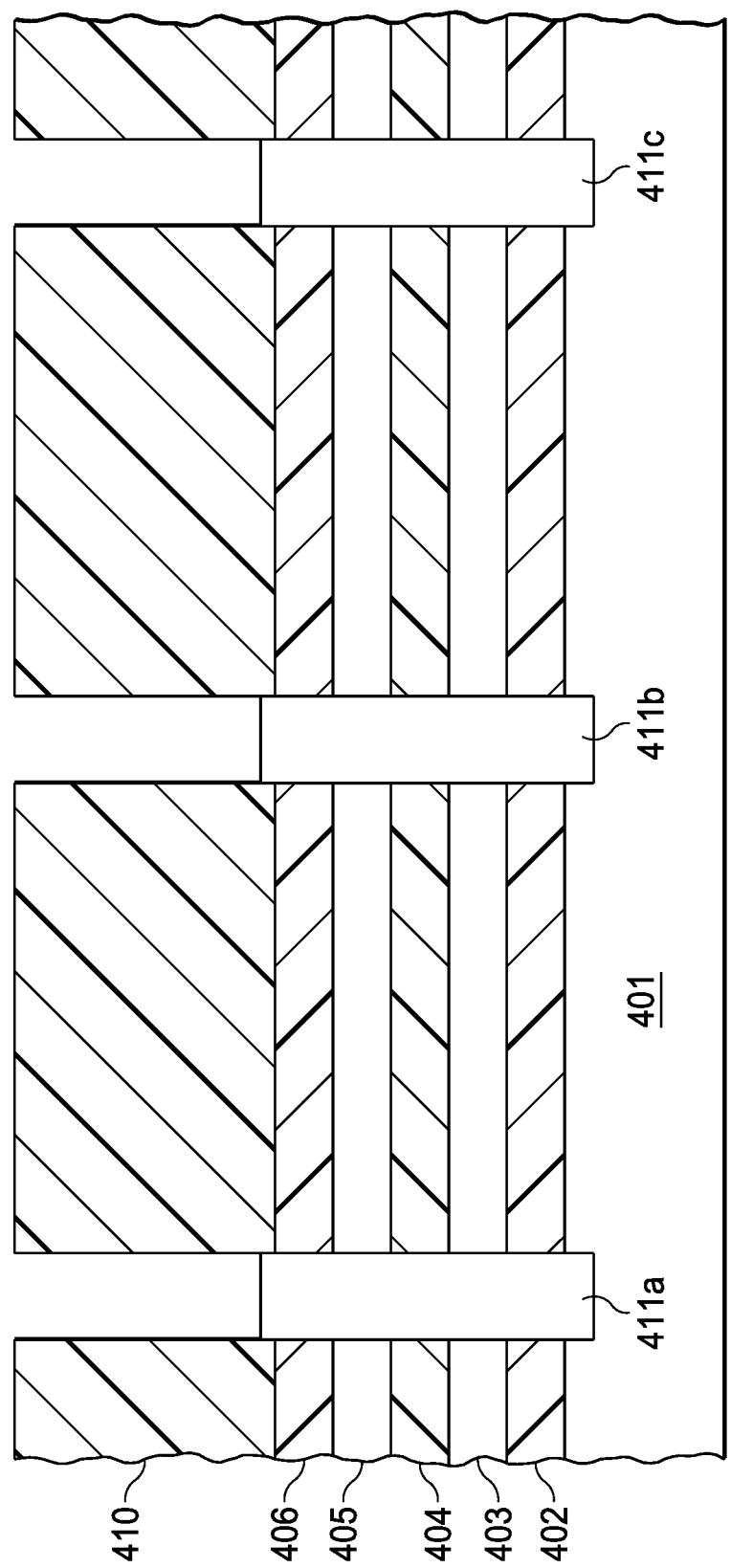
FIG. 7 depicts refilling the etch trenches in accordance with illustrative embodiments.

FIG. 7 depicts refilling the etch trenches in accordance with illustrative embodiments. After the etch trenches are formed through the semiconductor layers, pure Si dummy anchors 411a, 411b, 411c are formed in the trenches through epitaxial growth.

FIG. 8 depicts the semiconductor layers 402-406 with the etch mask removed in accordance with illustrative embodiments. In this step, the etch mask is removed leaving the semiconductor layers 402-406 and the newly formed Si dummy anchors 411a, 411b, 411c.

FIG. 9 depicts removal of the SiGe layers 402, 404, 406 from the substrate in accordance with illustrative embodiments. In this step the sacrificial SiGe layers 402, 404, 406 are removed, releasing the Si layers 403, 405. Releasing the Si layers 403, 405 leaves them locally suspended between the Si anchors 411. The SiGe can be removed by either wet or reactive-ion etching (RIE) processes. Examples of wet etching include a mixture of dilute hydrofluoric acid (DHF), hydrogen peroxide (H2O2), and acetic acid or a mixture of ammonium hydroxide (NH4OH), H2O2, and H2O. Examples of RIE include hydrochloric acid (HCL) based chemistry. By removing the SiGe layers 402, 404, 406 at this stage, the etchants that remove SiGe will not have to be used later after the spacers are formed between the Si channels (see below).

Figure 10:
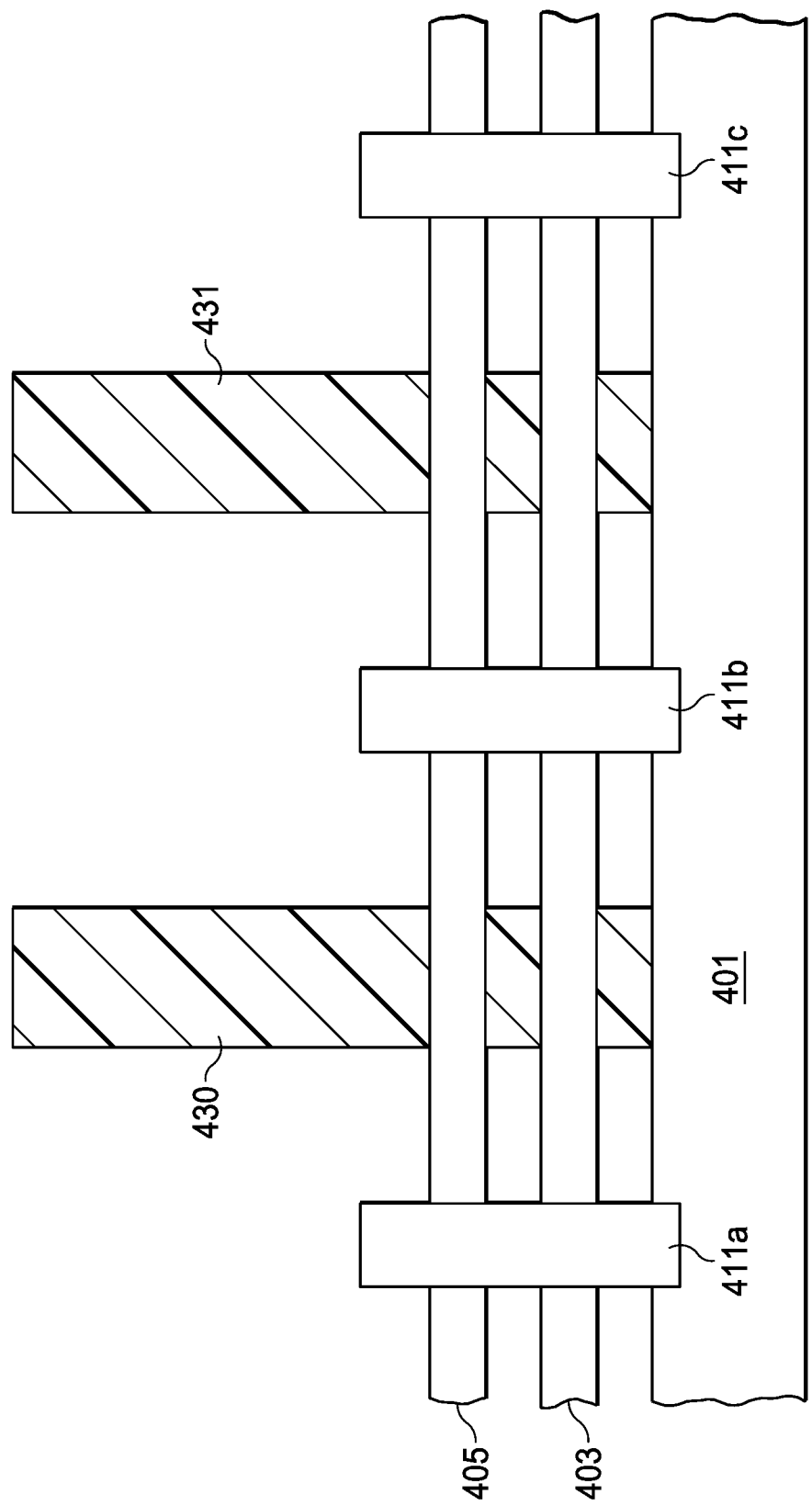
FIG. 10 depicts the formation of dummy gates in accordance with illustrative embodiments.

FIG. 10 depicts the formation of dummy gates in accordance with illustrative embodiments. In this example, the dummy gates 430, 431 comprise UV-lithography HSQ masks. In an embodiment the HSQ is spun on the wafer, exposed to extreme ultraviolet (EUV) by lithography and developed in tetramethylammonium hydroxide (TMAH) solution.

Figure 11:
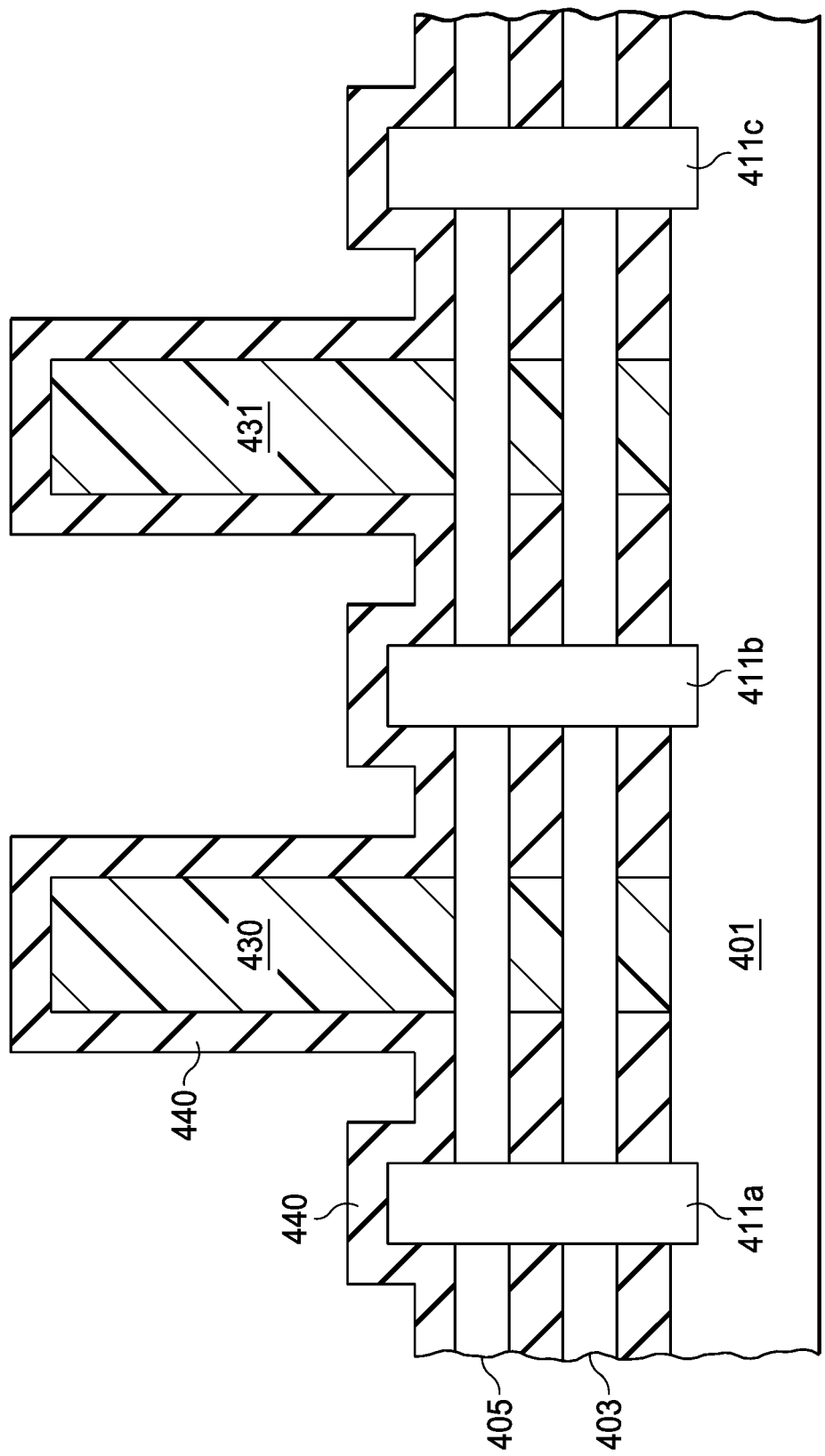
FIG. 11 depicts the deposition of a Low-K spacer material in accordance with illustrative embodiments.

FIG. 11 depicts the deposition of a Low-K spacer material in accordance with illustrative embodiments. After the formation of the dummy gates 430, 431, a Low-K (dielectric constant K <3.9) spacer 440 is deposited over the dummy gates and Si layers, filling the spaces left after removal of the SiGe layers 402, 404, 406. The presence of the dummy gates 430, 431 leads to symmetric spacer formation. In an embodiment, the Low-K spacer 440 is made of silicon boron carbon nitride (SiBCN). Examples of methods for deposition of the SiBCN include CVD, RTCVD, physical vapor deposition (PVD), and plasma-enhanced chemical vapor deposition (PECVD).

Figure 12:
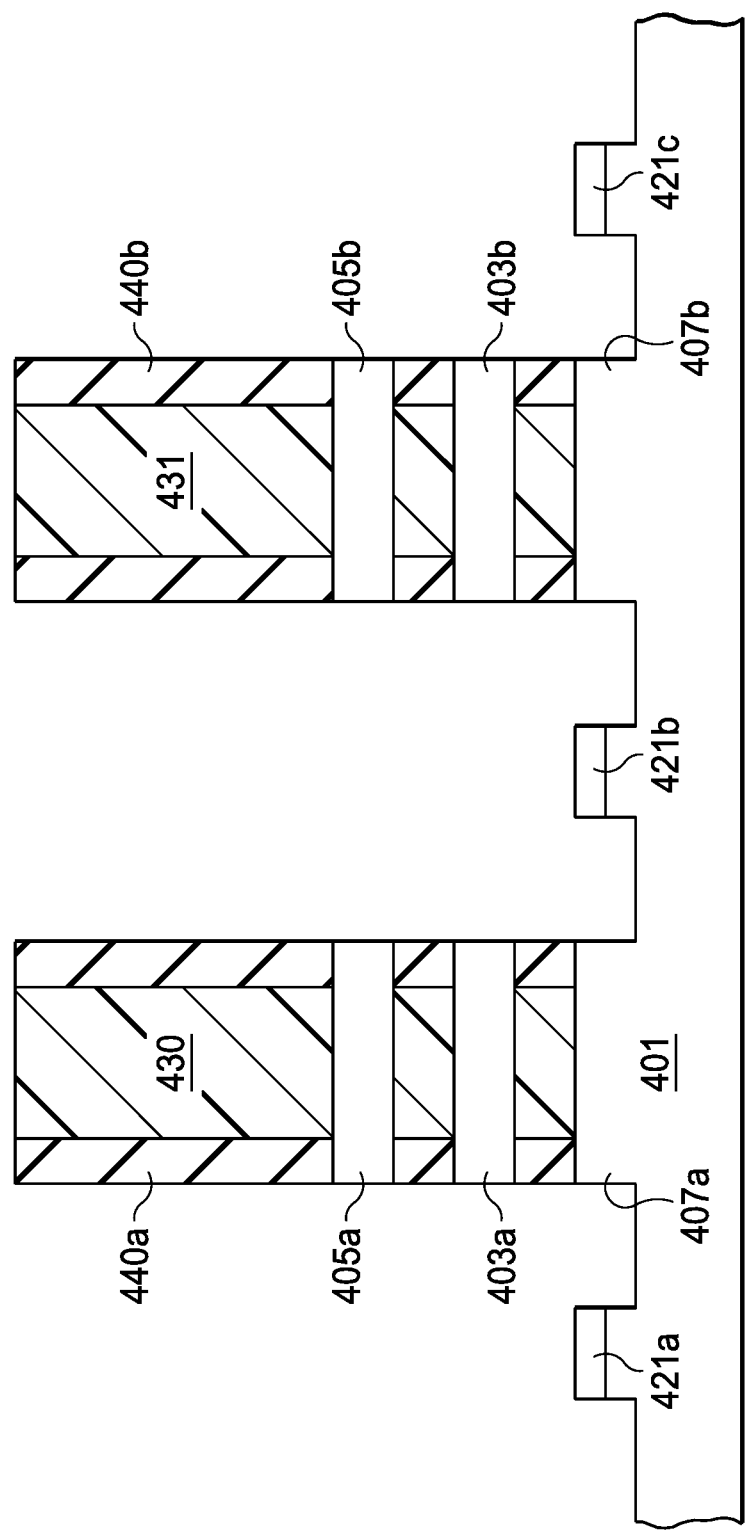
FIG. 12 depicts etching of the source/drain recesses in accordance with illustrative embodiments.

FIG. 12 depicts etching of the source/drain recesses in accordance with illustrative embodiments. The S/D recesses are etched on either side of the dummy gates 430, 431, leaving Si channels 403a, 403b, 405a, 405b, 407a, 407b which comprise the stacked nanosheets. In an embodiment the etch can be done in an RIE chamber with chemistries including chloride (CL) or bromide (Br) with high selectivity to the spacer and HSQ and no selectivity for Si or SiGe. The remaining SiBCN gate spacers 440a, 440b around the dummy gates 430, 431 serves as a protection layer during the S/D recess etching. The Si channels are protected by the HSQ dummy gates 430, 431, which wrap around them.

The etching recesses the Si anchors 411, leaving Si pads 421a, 421b, 421c protruding from the substrate 401. After the removal of the Si anchors 411, the Si channels 403a, 403b, 405a, 405b are held in place by the HSQ dummy gates 430, 431.

Figure 13:
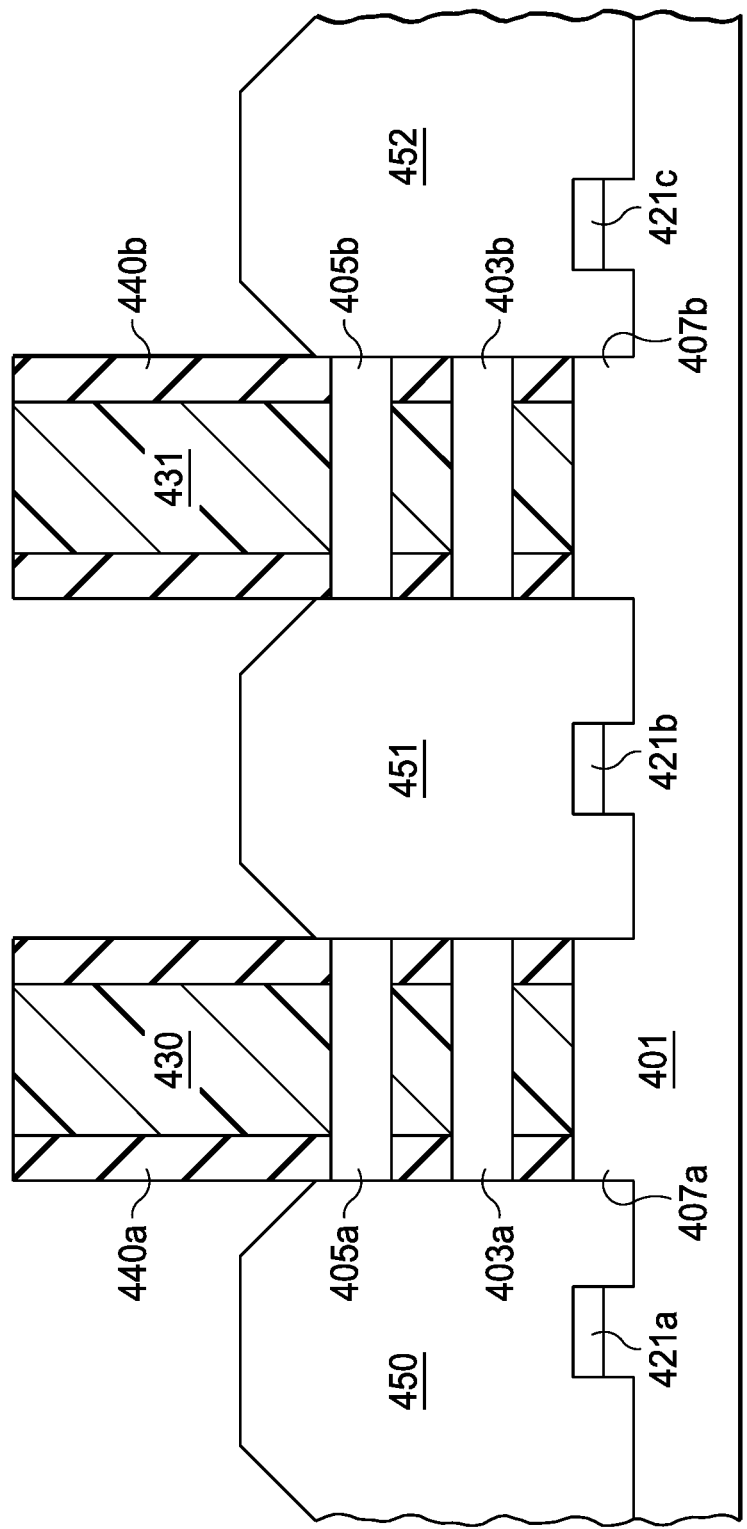
FIG. 13 depicts epitaxial growth of the source/drain in accordance with illustrative embodiments.

FIG. 13 depicts epitaxial growth of the source/drain in accordance with illustrative embodiments. In this step S/D 450, 451, 452 are epitaxially grown in the recesses in-situ and doped. The S/D 450, 451, 452 are grown over the Si pads 421a, 421b, 421c, respectively, which protrude into the bottoms of the S/Ds. In an embodiment, the S/D 450, 451, 452 can be made of phosphorus (P) or arsenic (As) doped Si or Si:C for a negative channel field effect transistor (nFET) or boron (B) doped Si or SiGe in the case of a positive channel FET (pFET).

Figure 14:
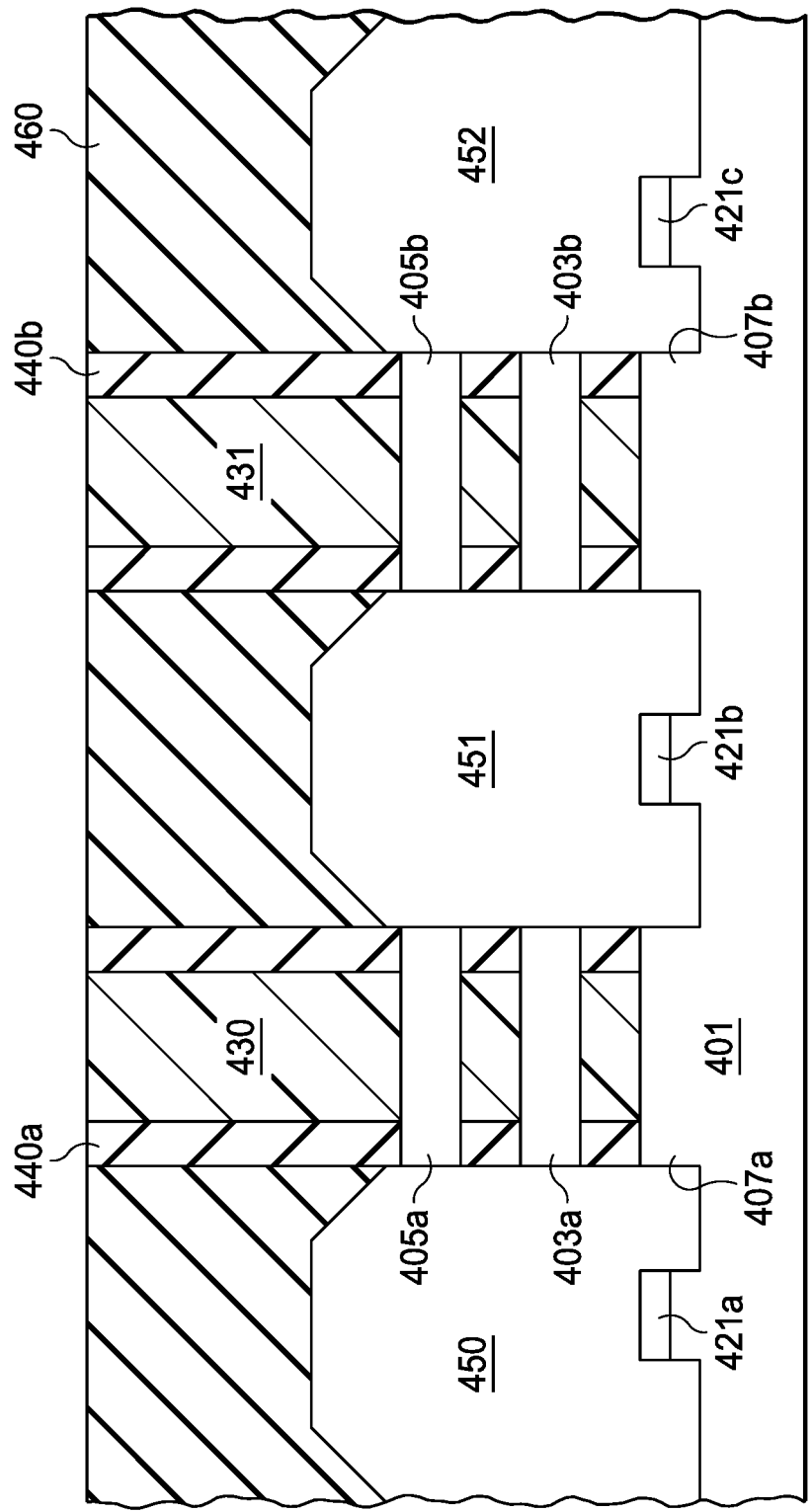
FIG. 14 depicts deposition of inter layer dielectric material in accordance with illustrative embodiments.

FIG. 14 depicts deposition of inter layer dielectric material in accordance with illustrative embodiments. After epitaxy of S/D 450, 451, 452, inter layer dielectric (ILD) 460 is deposited over the S/D. After deposition of the ILD 460, a chemical mechanical polish (CMP) is performed to planarize the ILD 460, the dummy gates 430, 431, and gate spacers 440a, 440b.

Figure 15:
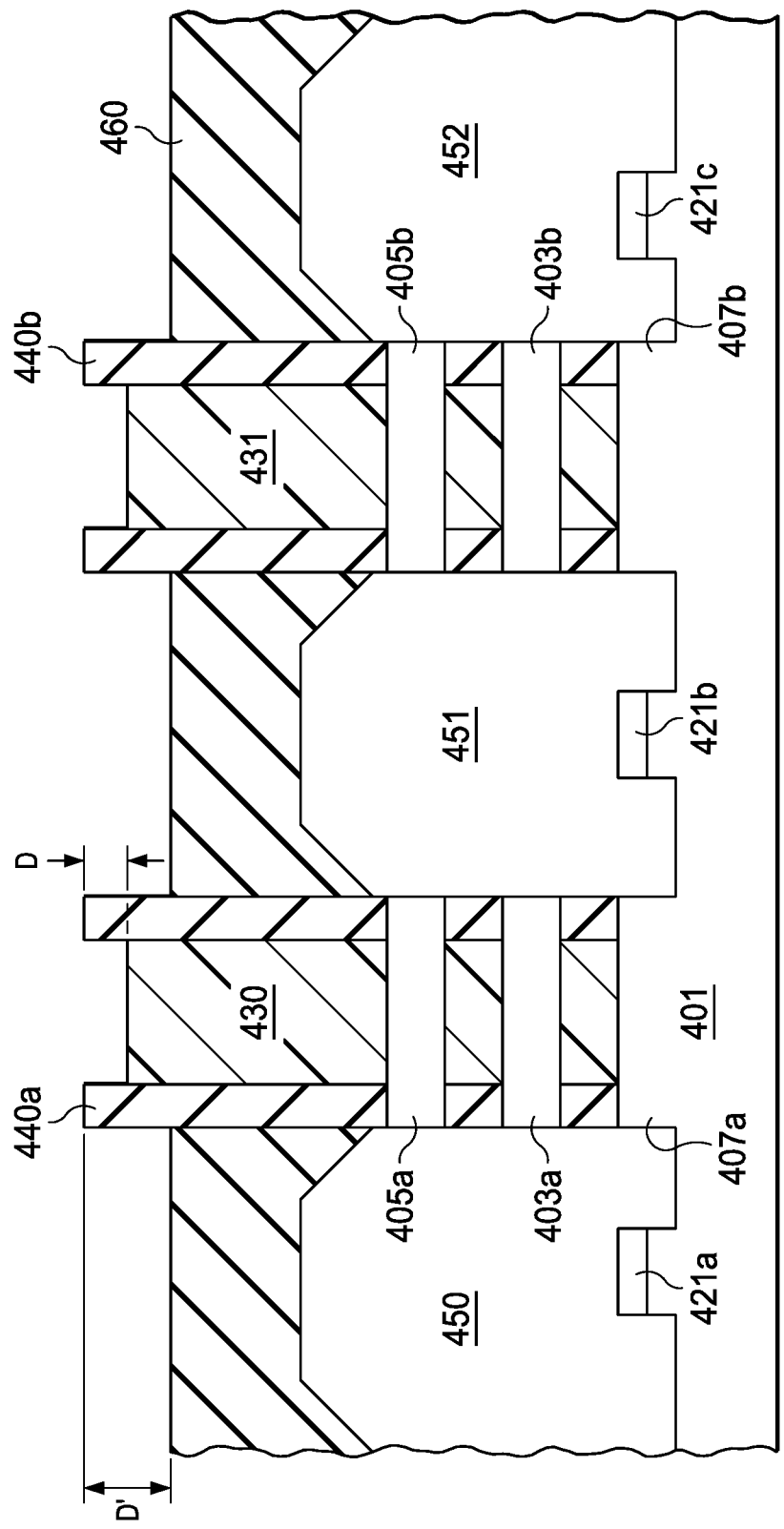
FIG. 15 depicts etching of the ILD in accordance with illustrative embodiments.

FIG. 15 depicts etching of the ILD in accordance with illustrative embodiments. In this step, the ILD 460 and dummy gates 430, 431 are etched back from the top of the gate spacers 440a, 440b. Because the annealed HSQ comprising the dummy gates has a lower etch rate than the ILD the dummy gate etch back distance D is smaller than the etch back distance D' of the ILD, as indicated in FIG. 15. An example etchant for this step in DHF.

Figure 16:
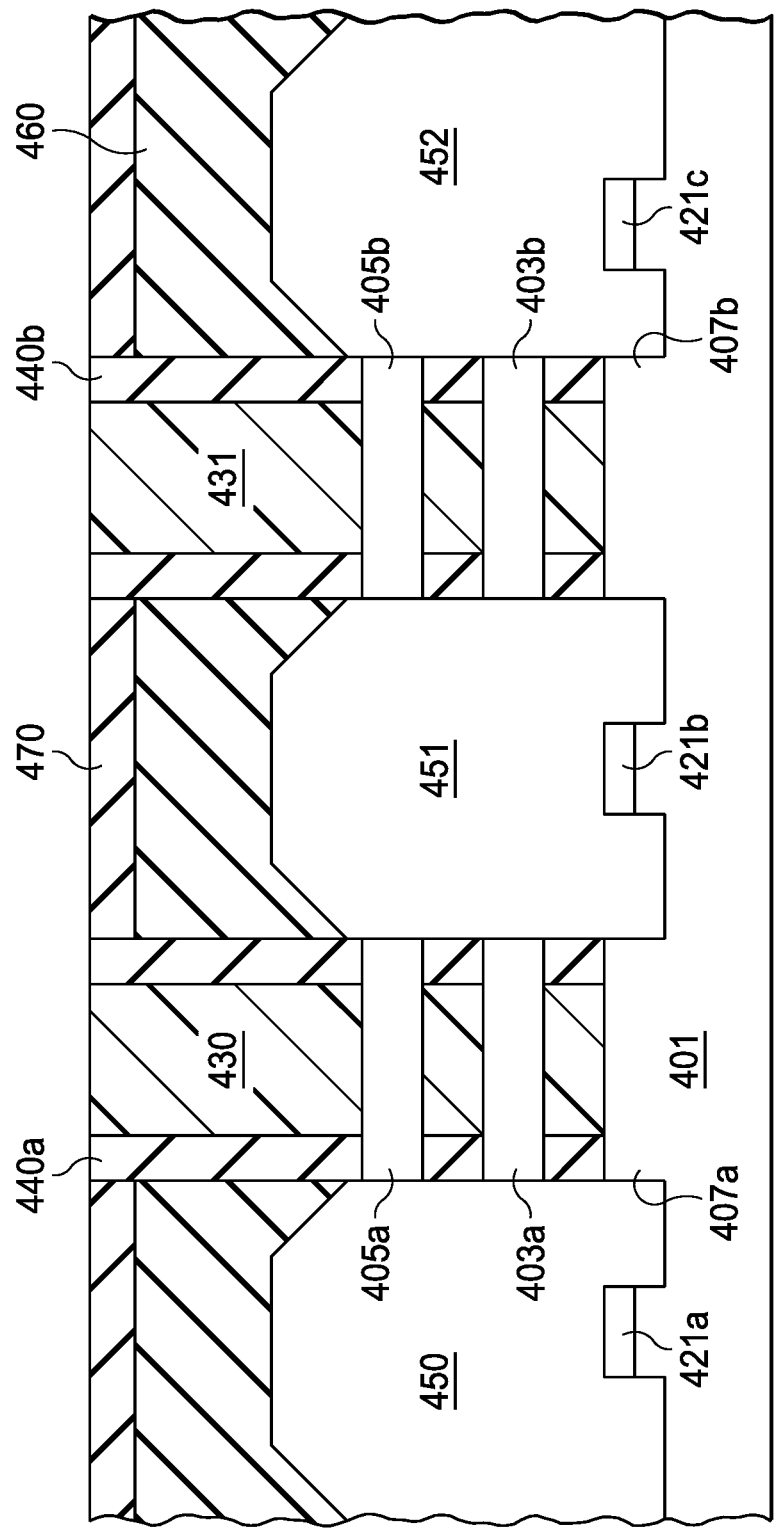
FIG. 16 depicts deposition of a dielectric within the ILD etch back in accordance with illustrative embodiments.

FIG. 16 depicts deposition of a dielectric within the ILD etch back in accordance with illustrative embodiments. The Low-K dielectric layer 470 deposited in the ILD etch back recess can comprise a nitride or SiBCN. The gate spacers 440a, 440b are then planarized with the dielectric 470 and top of the dummy gates 430, 431.

Figure 2:
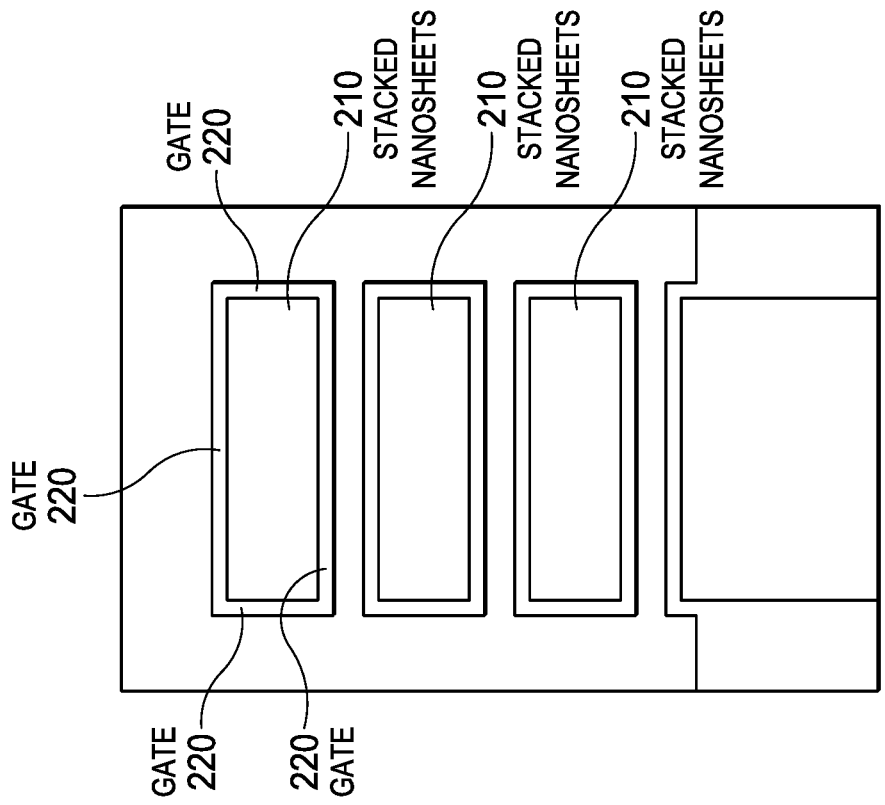
FIG. 2 depicts the basic schema of nanosheets as gate all around FETs.
Figure 1:
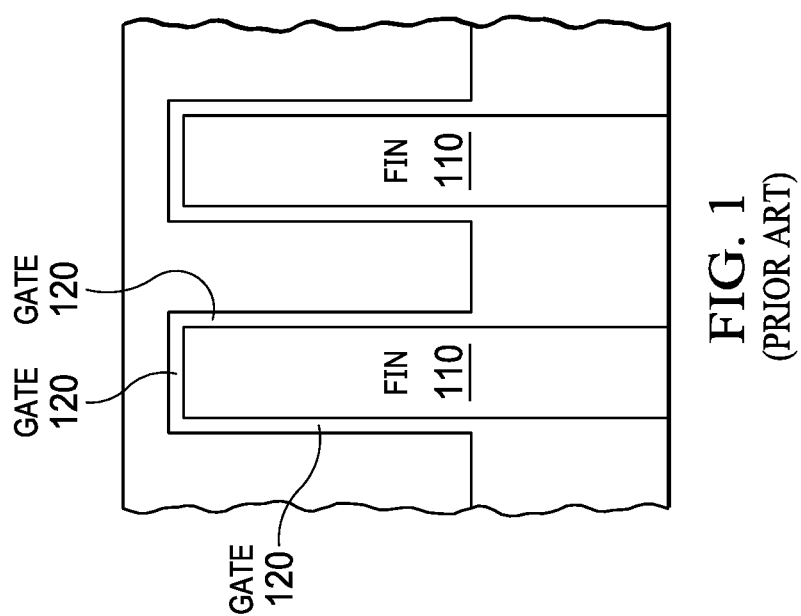
FIG. 1 depicts a FinFETs in accordance with the prior art.
Figure 3:
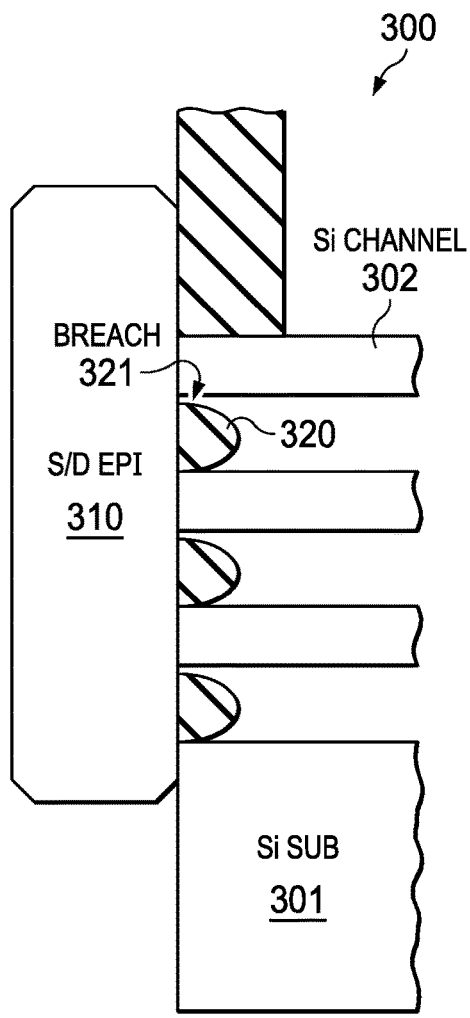
FIG. 3 depicts a stacked gate structure in accordance with prior art methods of manufacture.
Figure 17:
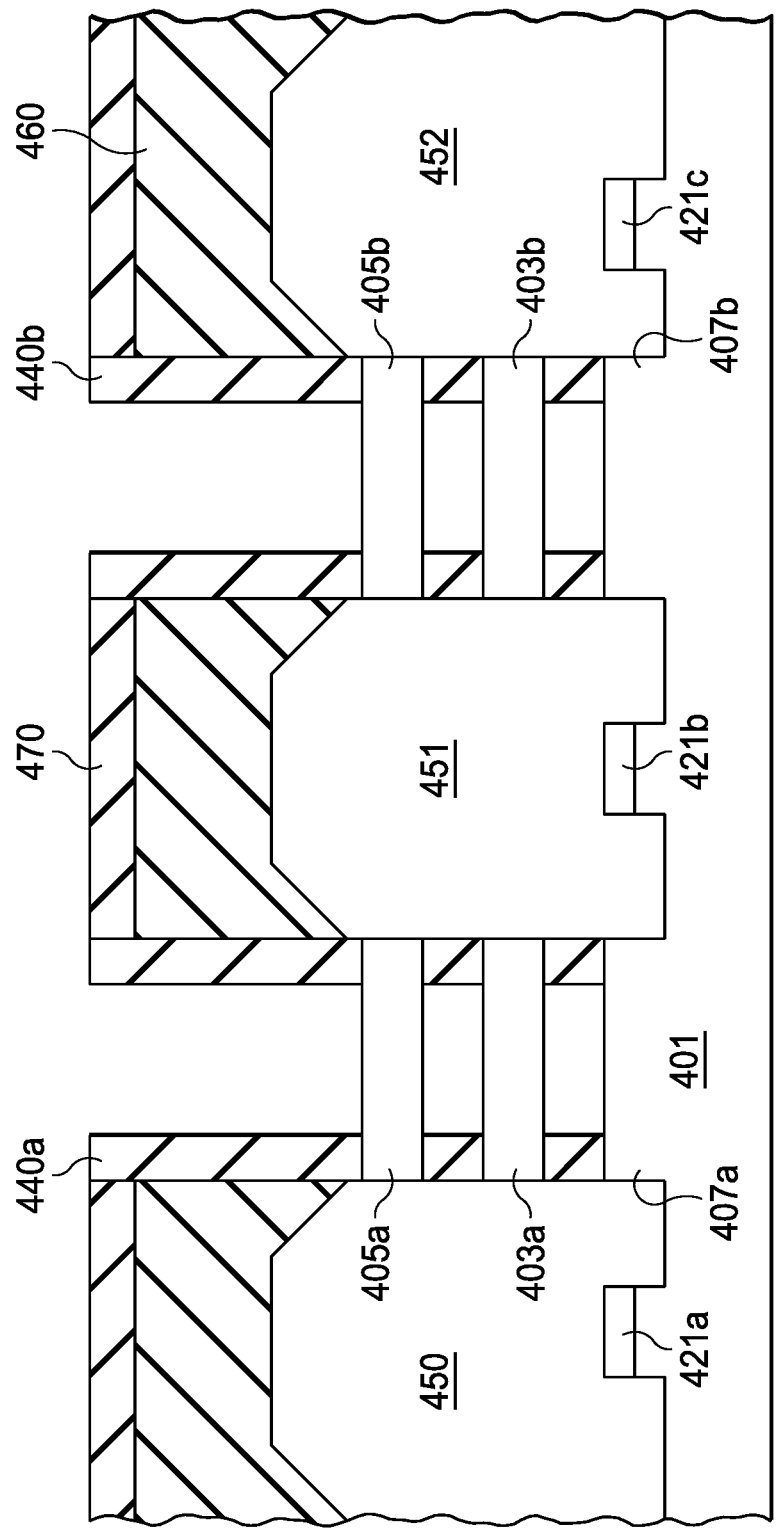
FIG. 17 depicts removal of the dummy gates in accordance with illustrative embodiments.

FIG. 17 depicts removal of the dummy gates in accordance with illustrative embodiments. After the deposition of dielectric 470 and planarization the dummy gates 430, 431 are removed. Because the SiGe layers 402, 404, 406 were previously removed (see FIG. 9) before formation of the spacers 440a, 440b, the etchant used to remove the HSQ dummy gates (e.g., dilute HF:H2O) does not attack the corners of the nitride spacers 440a, 440b and Si channels 403, 405, 407 like the etchants for SiGe would, thereby avoiding the formation of the half-moon shapes and potential breaches characteristic of the prior art as shown in FIG. 3.

The S/Ds 450, 451, 452 anchor the Si channels 403a, 403b, 405a, 405b and prevent them from falling when the HSQ dummy gates 430, 431 are removed.

Figure 18:
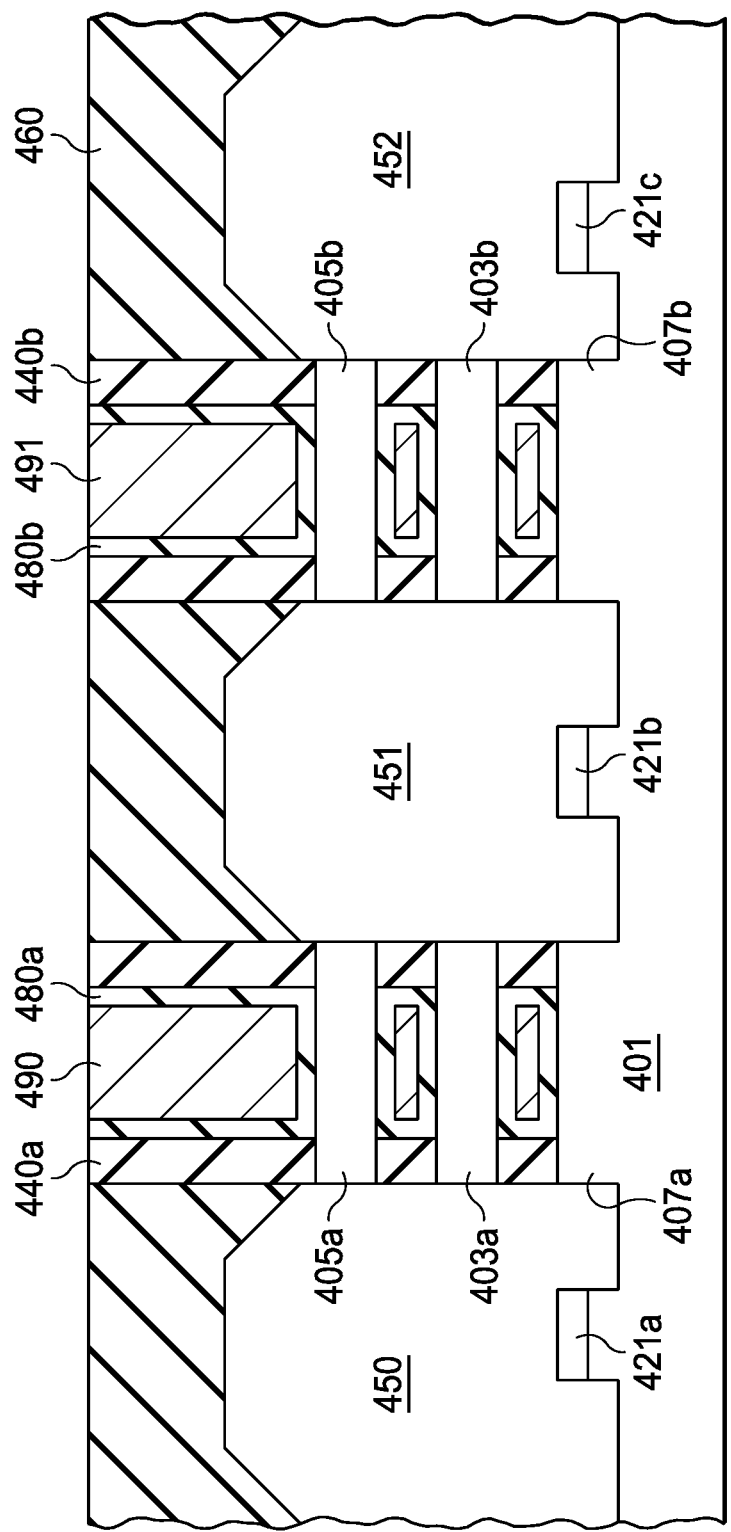
FIG. 18 depicts deposition of the metal gate in accordance with illustrative embodiments.

FIG. 18 depicts deposition of the metal gate in accordance with illustrative embodiments. After removal of the dummy gates, the top dielectric layer is removed and a layer of High-K (K >7) dielectric material 480a, 480b is deposited on the surface of the gate spacers 440a, 440b and Si channels 403b, 403b, 405a, 405b, 407a, 407b. Metal gates 490, 491 are then formed in the spaces left by the dummy gates using standard replacement metal gate (RMG) flow techniques.

Figure 19:
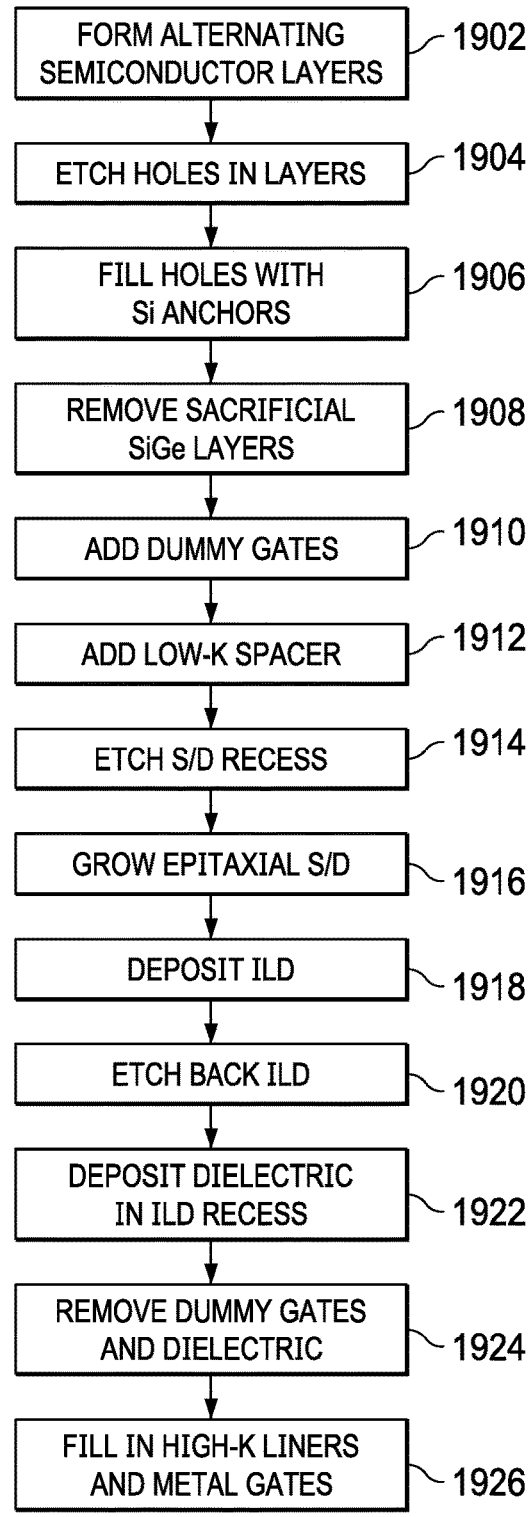
FIG. 19 is a flowchart depicting a fabrication method in accordance illustrative embodiments.

FIG. 19 is a flowchart depicting a fabrication method in accordance illustrative embodiments. The process begins with forming alternating semiconductor layers of Si and SiGe over a Si substrate (step 1902). Next holes are etched in the semiconductor layers (step 1904). The holes are filled with Si to form dummy pads/anchors (step 1906).

After formation of the Si anchors, the sacrificial SiGe layers are removed (step 1908), and the dummy gates are formed (step 1910). The Low-K spacer is then deposited (step 1912).

The S/D recesses are etched, leaving stacked nonsheet Si channels within the dummy gate stacks (step 1914). The S/D are then grown epitaxially in the recesses (step 516).

An ILD is deposited over the S/D (step 1918) and then etched backed (step 1920), and a nitride or SiBCN dielectric is deposited in the ILD etch back recess and planarized (step 1922).

The dummy gates and dielectric are then removed (step 1924), and the spaces are filled with a High-K liner, and the metal gates are formed using RMG flow (step 1926).

Though the illustrative examples in the figures depict the formation of two stacked channels, it should be understood and emphasized that this number is chosen merely for scale and ease of illustration and that more or less gates can be formed concurrently using the methods of the present disclosure.

The flowchart and diagrams in the figures illustrate the method and resulting architecture according to embodiments of the present disclosure. In this regard, each block in the flowchart or structural diagrams may represent a step or partial step, which comprise one or more procedures for implementing the illustrative embodiments. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of forming a stacked gate all around MOSFET, comprising steps of:
   stacking a number of semiconductor layers on a substrate, wherein the stacked layers alternate between a primary semiconductor material and a sacrificial semiconductor material;
   etching a number of holes through the stacked layers;
   forming anchors in the holes, wherein the anchors comprise the primary semiconductor material;
   removing the sacrificial semiconductor material;
   forming a number of dummy gates on the substrate;
   depositing a layer of spacer material around the dummy gates;
   etching a number of source/drain (S/D) recesses through the layers of primary semiconductor material and removing the anchors, wherein the dummy gates and spacer material preserve semiconductor channels from among the layers of primary semiconductor material during etching of the S/D recesses;
   forming S/Ds in the S/D recesses;
   removing the dummy gates, leaving spaces; and
   forming metal gates in the spaces left by the dummy gates.

2. The method of claim 1, wherein the primary semiconductor material is Si.

3. The method of claim 1, wherein the sacrificial semiconductor material is SiGe.

4. The method of claim 1, wherein the spacer material comprises SiBCN.

5. The method of claim 1, wherein the dummy gates comprise HSQ.

6. The method of claim 1, further comprising depositing a dielectric over the S/Ds.

7. The method of claim 6, further comprising:
  etching back the dielectric from the top of the spacer material around the dummy gates to form an etch recess; and
  depositing a Low-K dielectric layer in the etch recess before removal of the dummy gates.

8. The method of claim 1, further comprising depositing a layer of High-K dielectric within the spaces left by the dummy gates before forming the metal gates.

9. The method of claim 1, wherein the S/Ds are grown epitaxially.

10. A method of forming a stacked gate all around MOSFET, comprising steps of:
  forming a stack of a number of alternating layers of Si and SiGe on a substrate;
  etching a number of holes through the stack;
  forming Si anchors in the holes;
  removing the SiGe layers;
  forming a number of dummy gates on the substrate;
  depositing a Low-K spacer material around the dummy gates;
  etching a number of source/drain (S/D) recesses through the Si layers and removing the Si anchors, wherein the dummy gates and spacer material preserves sections of the Si layers during etching of the S/D recesses, forming stacks of Si channels;
  forming S/Ds in the S/D recesses; and
  removing the dummy gates and replacing them with metal gates.

11. The method of claim 10, further comprising depositing a High-K layer inside spaces left by the dummy gates before forming the metal gate stacks.

12. The method of claim 10, wherein the dummy gates comprise HSQ.

13. The method of claim 10, wherein the spacer material comprises SiBCN.

14. The method of claim 10, further comprising depositing a dielectric over the S/Ds.

15. The method of claim 14, further comprising:
  etching back the dielectric from the top of the spacer material around the dummy gates to form an etch recess; and
  depositing a Low-K dielectric layer in the etch recess before removal of the dummy gates.

16. The method of claim 10, wherein the S/Ds are grown epitaxially.

17. A stacked gate all around MOSFET, comprising:
  a substrate;
  a number of stacked Si channels over the substrate;
  a metal gate surrounding the stacked Si channels;
  a spacer surrounding the metal gate stack;
  a source/drain (S/D) on opposite ends of the stacked Si channels; and
  a Si pad protruding from the substrate into a bottom surface of each S/D.

18. The MOSFET of claim 17, further comprising a High-K dielectric layer between the metal gate and spacer.

19. The MOSFET of claim 17, wherein the S/D comprises P or As doped Si or Si:C.

20. The MOSFET of claim 17, wherein the S/D comprises B doped Si or SiGe.

* * * * *